US011114176B1

United States Patent
Lee et al.

(10) Patent No.: US 11,114,176 B1
(45) Date of Patent: Sep. 7, 2021

(54) SYSTEMS AND METHODS TO PROVIDE WRITE TERMINATION FOR ONE TIME PROGRAMMABLE MEMORY CELLS

(71) Applicant: QUALCOMM Incorporated, San Diego, CA (US)

(72) Inventors: Hochul Lee, Los Angeles, CA (US); Anil Chowdary Kota, San Diego, CA (US); Keejong Kim, Phoenix, AZ (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/811,145

(22) Filed: Mar. 6, 2020

(51) Int. Cl.
G11C 17/00 (2006.01)
G11C 17/18 (2006.01)
G11C 17/16 (2006.01)

(52) U.S. Cl.
CPC .............. G11C 17/18 (2013.01); G11C 17/16 (2013.01)

(58) Field of Classification Search
CPC ................................. G11C 17/18; G11C 17/16
USPC ......................................................... 365/96
See application file for complete search history.

(56) References Cited

U.S. PATENT DOCUMENTS

| 7,136,322 | B2 | 11/2006 | Brennan et al. |
| 8,154,941 | B2 | 4/2012 | Ito |
| 8,842,482 | B1 | 9/2014 | Kunst et al. |
| 8,917,533 | B2 | 12/2014 | Chung |
| 9,478,308 | B1 * | 10/2016 | Boujamaa .............. G11C 7/065 |
| 9,570,192 | B1 | 2/2017 | Yoon et al. |

OTHER PUBLICATIONS

Farkhani H., et al., "STT-RAM Energy Reduction Using Self-Referenced Differential Write Termination Technique," IEEE Transactions on Very Large Scale Integration (VLSI) Systems, vol. 25, No. 2, Feb. 2017, pp. 476-487.

* cited by examiner

Primary Examiner — Huan Hoang
(74) Attorney, Agent, or Firm — Qualcomm Incorporated

(57) ABSTRACT

A One Time Programmable (OTP) memory, includes: a first driver coupled to a reference cell by a first bit line; a second driver coupled to an OTP cell by a second bit line; and a comparator having a first input coupled to the first bit line and the reference cell, a second input coupled to the second bit line and the OTP cell, and an output coupled to a logic circuit configured to control the first driver and the second driver.

30 Claims, 11 Drawing Sheets

SYSTEMS AND METHODS TO PROVIDE WRITE TERMINATION FOR ONE TIME PROGRAMMABLE MEMORY CELLS

TECHNICAL FIELD

This application relates to One Time Program (OTP) data and, more specifically, to systems and techniques to write OTP data.

BACKGROUND

A mobile computing device, such as a smart phone, contains a multi-processor chip to provide computing power. The multi-processor chip has secure data stored thereon in a One Time Program (OTP) memory. An example of an OTP memory includes an array of electronic fuses that can be programmed once by selectively blowing some of the fuses in the array. For example, a blown fuse may represent a binary one, and an un-blown fuse may represent a binary zero. These fuses may be blown only once and may not be repaired after being blown, so that the data stored by blowing the fuses is considered read-only after programming.

Continuing with the example, the secure data is read during power on or boot up of the chip. Examples of secure data that may be stored include hardware keys, boot read-only memory (ROM) patches, chip configuration information, and Original Equipment Manufacturer (OEM) information.

An example OTP cell includes a transistor and a fuse link, where the transistor may turn on to permit current to flow through the fuse to blow the fuse. Continuing with the example, an unblown fuse may have a low resistance, whereas a blown fuse may have a high resistance. Furthermore, some existing OTP memories may include multiple thousands (e.g., 20,000) of OTP cells, each with its own fuse. Process variation may cause some of the fuses to differ physically from other fuses so that some fuses may use more current to blow than do other fuses. Therefore, some systems may apply a relatively large amount of current for a relatively long time to all the fuses to be blown, thereby ensuring that even a fuse that uses more current than others would be expected to blow. In other words, such example systems treat all fuses to be blown according to a worst-case scenario so that all the fuses intended to be blown are blown.

However, systems that apply relatively large current for a relatively long amount of time to all fuses to be blown may experience some disadvantages. For instance, a large amount of current for a long amount of time may in some instances damage other circuit components within the current path. Also, to the extent that process variation exists within an OTP memory, treating all of the fuses to be blown in a like manner may create a performance distribution in which a lowest resistance for a blown fuse differs significantly from a highest resistance for a blown fuse within the same system. And since some existing systems have no mechanism to verify that a fuse is blown, instead relying upon the current and time to ensure that fuses are blown, there is a chance that some fuses may simply not blow because of extraordinary variation, and this may reduce yield.

An additional disadvantage may include time taken to program an OTP memory. For instance, if each fuse to be blown takes around 0.5 µs, and the OTP memory includes multiple thousands of fuses to be blown one after another, then the total time taken to program the OTP memory may be noticeable and expensive.

There is currently a need for a more robust technique to program OTP memories, ensuring that fuses to be blown are blown, while reducing time taken to program.

SUMMARY

Various implementations include systems and methods employing a closed loop OTP programming technique. In one example implementation, current is applied to a fuse, and when it is detected that the fuse is blown, the system stops the current by, e.g., disabling a blow driver.

In one implementation, a system includes a One Time Programmable (OTP) memory, including: a first driver coupled to a reference cell by a first bit line; a second driver coupled to an OTP cell by a second bit line; and a comparator having a first input coupled to the first bit line and the reference cell, a second input coupled to the second bit line and the OTP cell, and an output coupled to a logic circuit configured to control the first driver and the second driver.

In another implementation, a method includes applying a driver control signal to a first driver coupled to a reference cell by a first bit line; applying the driver control signal to a second driver coupled to an OTP cell by a second bit line; generating a first current by the first driver, thereby generating a reference voltage at a first input of a comparator that is coupled to the first bit line; generating a second current by the second driver, thereby generating an OTP cell voltage at a second input of the comparator that is coupled to the second bit line; and adjusting the driver control signal in response to a change of the OTP cell voltage associated with the OTP cell being blown by the second current.

In yet another implementation, a Read Only Memory (ROM), includes: means for producing a first current on a first bit line; means for producing a second current on a second bit line; a reference resistor coupled between the first bit line and a ground; a One Time Programmable (OTP) cell coupled between the second bit line and the ground; and means for turning off the second current producing means in response to a change in a voltage at the second bit line relative to a voltage at the first bit line.

DETAILED DESCRIPTION

Figure 1:
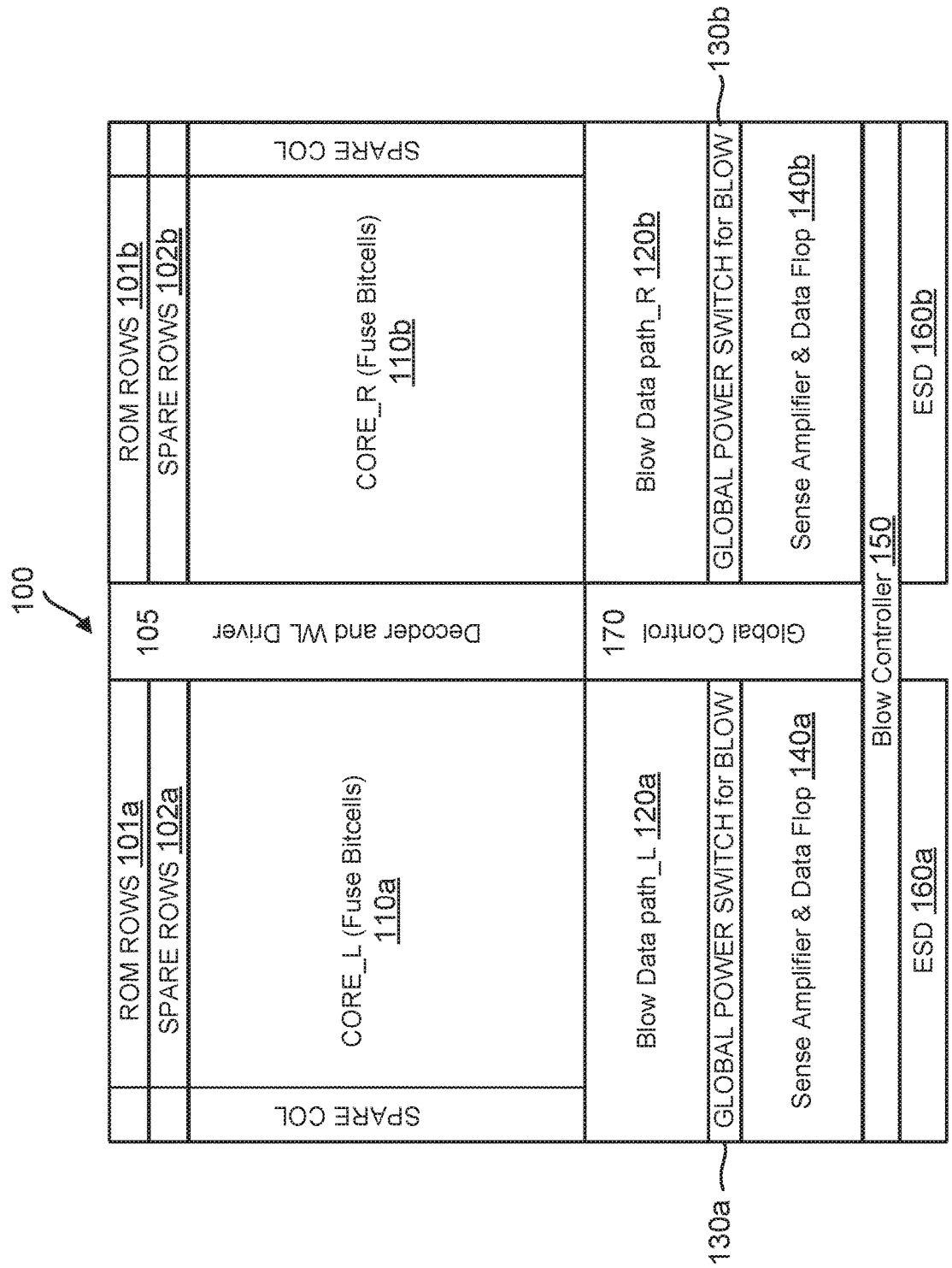
FIG. 1 is an illustration of an example OTP module according to various implementations.

Various implementations provide for systems and methods to program OTP cells. Specifically, some implementations include a feedback loop to determine when a fuse has been blown. When the feedback loop determines that the fuse has been blown, then it may turn off the blowing current. In some implementations, once the fuse is blown, the system moves to a next fuse to be blown and performs the same technique. The system may blow each of the fuses to be blown in this manner.

One example architecture includes a first blow current driver that is coupled to a reference resistance and a second blow current driver that is coupled to an OTP cell. The reference resistance is coupled to a node on a dummy bit line, and the fuse of the OTP cell is coupled to a node on its corresponding bit line. A comparator has one input from the node on the dummy bit line and another input from the node on the corresponding bit line. When both blow current drivers are on, and before the fuse is blown, the voltage at the node on the corresponding bit line may be lower than the voltage at the node on the dummy bit line. However, that changes when the fuse blows because the voltage at the node on the corresponding bit line increases past the level of the voltage at the node on the dummy bit line. This causes the output of the comparator to flip. When the output of the comparator flips, controller circuitry may then disable both drivers, thereby turning off the current to the reference resistance and to the fuse.

As noted above, some systems may include multiple thousands of OTP cells. Accordingly, the example system may move on to a next fuse to be blown and perform the same blowing technique. One example system includes a multiplexing function that is either controlled by the control circuit or implemented as part of the control circuit to apply control (e.g., enable) signals to a multitude of blow current drivers. For instance, the multiplexor may apply an enable signal to a first blow current driver when a first OTP cell is being blown, and after the first OTP cell is blown, the multiplexor may apply an enable signal to a second blow current driver to blow a second OTP cell, and on and on. The multiplexing function may also multiplex the voltage from each respective bit line to the comparator. The multiplexing function may allow the same reference blow current driver, reference resistance, and comparator to be used for a plurality of OTP cells.

In one example, the control circuitry may be as simple as a logic gate, such as an OR gate receiving an enable signal and a signal from the comparator. In another example, the control circuitry may be more complex, including, e.g., multiplexing functions.

In one example, the voltage input to the comparator may be detected from a write bit line. In another example, the voltage input to the comparator may be detected from a read bit line. In any event, the detected voltage change may be a bit line voltage. An advantage of measuring the voltage on a bit line is that it may have a higher voltage, and therefore a larger detection margin, as compared with measuring the voltage somewhere else, such as at a source line.

Various implementations may provide one or more advantages over known systems. For instance, various implementations may save time for programming an OTP memory when compared to systems that simply apply the same amount of current for a same amount of time to all OTP cells. One experiment indicated that even with process variation taken into account, it usually takes around 0.5 μs for a typical fuse to blow at 20 mA. Nevertheless, some existing systems may apply 20 mA for as much as 10 to 20 μs for each fuse to ensure that each fuse blows. By contrast, various implementations of the present disclosure may apply current for enough time to blow each fuse and no more, thereby saving time by an order of magnitude or more compared to existing systems. Of course, due to process variation, some fuses may take longer to blow than others. However, it is expected that overall time is saved because the majority of fuses may blow within a short amount of time and only a minority of fuses may take as long as the 10 or 20 μs used by existing systems.

Another advantage of some implementations of the present disclosure includes reduced power use. Specifically, power use to program an OTP memory may be expected to be decreased for the same reason that time to program the OTP memory may be decreased. That is, over a multitude of OTP cells, the amount of time that the current is applied may be shortened, thereby reducing power.

Reduction of power and reduction of time in programming an OTP memory may be expected to reduce costs. For instance, decreasing an amount of power may decrease electricity costs for the entity programming the OTP memory. Also, time spent by personnel or machinery to perform the programming may be reduced, thereby reducing personnel and machine costs.

Furthermore, while OTP programming is generally performed at a manufacturing facility for the chip on which the OTP memory is built, OTP programming may be expected to be more common at customer facilities in the future. It may be expected that customers (e.g., cell phone manufacturers) desire to keep their costs low as well and, thus, the systems and techniques described herein may be expected to provide a competitive advantage.

An additional advantage of some implementations may include increased consistency in blown fuse resistance. Specifically, it is generally expected that the resistance of a blown fuse is about 10 kΩ in some applications. However, some systems that apply a same voltage for a same time to all of the blown fuses may cause some fuses to be slightly under blown and some fuses to be slightly overblown. When a fuse is under blown or overblown, its resistance may differ from its nominal value of, e.g., 10 kΩ. By contrast, various implementations of the present description may apply just enough current for just enough time to blow a fuse, thereby reducing or avoiding under blowing and over blowing fuses. Overall, more consistent fuse blowing may be expected to provide more consistent blown fuse resistances, which may lead to higher yield. The scope of implementations is not limited to any particular blow current level, time, or blown resistance.

Additionally, the advantage of reducing or avoiding under blowing and over blowing fuses may be further provided by the reference resistance that is described in more detail further below in this disclosure. In an example implementation, a same reference resistance is used for programming multiple OTP cells, thereby providing consistency across those multiple OTP cells.

FIG. 1 is a simplified diagram illustrating an example OTP module 100 (a ROM) in which various implementations may be implemented. OTP module 100 is shown in FIG. 1 by itself, but it is understood that it may be included in a processing device, such as a central processing unit (CPU), digital signal processor (DSP), a system on chip (SOC) having multiple processing cores on a chip, a package including multiple chips, and/or the like.

According to examples herein, the processing device in which OTP module 100 is implemented may include a tablet computer, a smart phone, or other appropriate device. However, the scope of implementations is not limited to a smart phone or tablet computer, as other implementations may include a laptop computer or other appropriate device. In fact, the scope of implementations includes any particular computing device, whether mobile or not.

OTP module 100 is shown having two halves that are substantially similar and share global control block 170 and blow controller 150. OTP module 100 has two OTP cores- left core 110a and right core 110b. Within each half, the OTP elements are arranged as an array of memory elements in rows and columns. In this example, the columns are referred to as bit lines, and the rows are referred to as word lines. ROM rows 101 include a check pattern, and each half also includes spare rows 102. Cores 110 include secure data. Each row is a word that can be read out of OTP module 100 under the direction of global control block 170.

Examples of secure data in cores 110 may include, but are not limited to, configuration information for the processing device, hardware keys for the processing device, boot ROM patches, OEM manufacturer information, and the like. Secure data is generally data that is included by the manufacturer of the processing device or a manufacturer of a computer into which the processing device is implemented, and the secure data is usually only read by underlying processes within the processing device and is not intended to be accessible by an end-user. Secure data may or may not be encrypted.

Rows 101 contain a pre-programmed check pattern of binary 0s and 1s. A firmware process reads the check pattern rows 101 during power up to determine whether the secure data in cores 110 has been tampered with. In this manner, the firmware process can compare what it reads out to the known value of the check pattern, and if there is a mismatch, the firmware process may determine that there has been an attack on the OTP module.

The secure data and the check pattern are saved in the OTP module 100 using fuses. For example, a blown fuse creates high resistance and may be read as a binary one, where as a fuse that is not blown may have a low resistance and is read as a binary zero. However, the scope of implementations may include a system in which a blown fuse is read as a binary zero, and a fuse that is not blown is read as a binary one. Furthermore, the scope of implementations is not limited to fuses, as other appropriate memory elements may be used. Other examples include antifuses and non-volatile RAM. Nevertheless, for ease of illustration, the examples herein refer to fuses (e.g., electronic fuses, or "e-fuses"). The fuses of the cores 110 and the rows 101 may be programmed according to the techniques described herein.

OTP module 100 also includes sense amplifiers, which operate to read the data stored in the memory elements, in items 140. OTP module 100 also includes flip-flops and drivers to capture the data that is read out, in items 140. When reading data, each of the sense amplifiers receives a voltage that corresponds to a particular memory cell that is selected in its respective column. For example, a blown fuse may cause a high voltage, and an un-blown fuse may cause a low voltage. The sense amplifiers of item 140 may compare a resulting voltage from a fuse to a reference voltage and then output a resulting value to a flip-flop of item 140.

Global control block 170 includes firmware logic to decode read requests, apply control signals to the word lines, bit lines, sense amplifiers, and flip-flops. Global control block 170 may also include firmware logic to control the global power switches 130, the blow controller 150, and multiplexing functions.

Continuing with the example, each blow data path 120 may include a local power switch for blowing fuses, such as by turning on or off a word line transistor to allow current through a given fuse. Global power switches 130 may include power switches within a shared power domain or a separate blow power domain for providing power to the blow drivers, which are described in more detail with respect to FIG. 2. Blow controller 150 is described in more detail with respect to FIG. 2 as well. In short, blow controller 150 may include logic to turn on or off blow drivers and may include multiplexing logic as well. Furthermore, OTP module 100 may also include electrostatic discharge (ESD) protection circuits 160.

Figure 2:
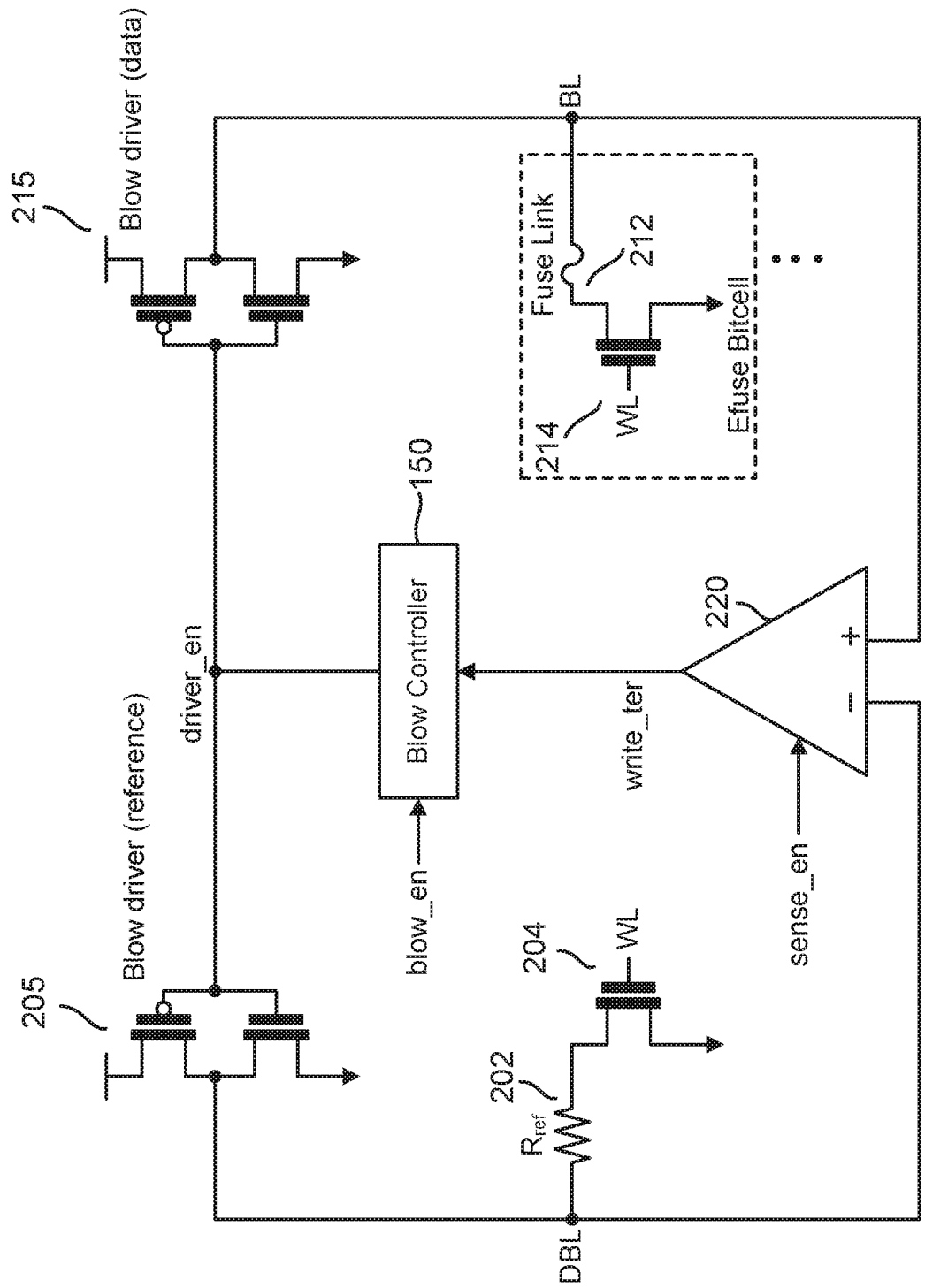
FIG. 2 is an illustration of an example physical architecture of one OTP cell and a programming feedback loop, according to one implementation.

FIG. 2 is an illustration of an example physical architecture of one OTP cell and a programming feedback loop, according to one implementation. The architecture of FIG. 2 includes a first blow driver 205 and a second blow driver 215. Each of the blow drivers 205, 215 apply current to their respective bit lines when enabled. The driver enable signal is shown in FIG. 2 as driver_en.

Looking to the left-hand side first, blow driver 205 is coupled to a first bit line and a reference resistor 202. The first bit line is for fuse blowing purposes only and, thus, is not used for reading or writing and also does not include an OTP cell. Thus, the left-hand side bit line is referred to as a dummy bit line. The reference resistor 202 is coupled to the dummy bit line at the node DBL. Word line transistor 204 couples the reference resistor 202 to ground. Although not shown in FIG. 2, the word line transistor 204 may be controlled by global control block 170 of FIG. 1. When word line transistor 204 is on, it allows current to flow through the reference resistor 202, thereby creating a measurable reference voltage at the node DBL.

Now looking to the right-hand side, blow driver 215 is coupled to a second bit line and fuse 212. The second bit line is for writing and reading the OTP cell that includes fuse 212. Therefore, the second bit line is not a dummy bit line.

When blow driver 215 is enabled by enable signal driver_en, it provides current that flows through fuse 212 when word line transistor 214 is on. As with word line transistor 204, word line transistor 214 may be controlled by global control block 170 of FIG. 1. When current flows through fuse 212, and fuse 212 is unblown, the current may cause electro-migration in the metal of the fuse material, eventually creating a high resistance path through the fuse 212. Once the high resistance path is created, the fuse is considered blown.

For instance, in some examples, the unblown fuse resistance may be about 50Ω, whereas the blown fuse resistance may be about 10 kΩ. Of course, these figures for resistance are for example only, and the scope of implementations may include any appropriate resistance value for both blown and unblown fuses. When current passes through fuse 212 in an unblown state, the voltage at node BL is relatively low. By contrast, when current passes through fuse 212 in a blown state, the voltage at node BL is relatively high. Accordingly, in this example, the reference resistor 202 is sized to cause a reference voltage at node DBL that is greater than a voltage at node BL when fuse 212 is unblown and lower than a voltage at node BL when fuse 212 is blown.

In the present example, the architecture of FIG. 2 also includes comparator 220. Comparator 220 may include any appropriate comparator design such as, for example, a symmetrical sense amplifier design. An example symmetrical sense amplifier design is shown in more detail with respect to FIG. 7. Comparator 220 includes an inverting input that is coupled to node DBL and a non-inverting input that is coupled to node BL.

Blow controller 150 receives the output of the comparator and, in response, either asserts or de-asserts driver_en. Blow controller 150 may include transistor logic gates in some implementations or another implementations, may include firmware-based functionality provided by a larger processing circuit. Furthermore, as discussed in more detail below, blow controller 115 may integrate multiplexing functionality or may control other multiplexing functionality.

Now looking to operation of the architecture of FIG. 2, the blow controller enable signal blow_en is not yet asserted, and the output of blow controller 150 is a digital 1, and both blow drivers 205, 215 are off. The blow controller enable signal blow_en may be supplied, e.g., by global control block 170 of FIG. 1. Furthermore, at this point, the comparator 220 is not yet enabled because its enable signal, sense_en, is not asserted. Various implementations may not enable the comparator 220 at this point to avoid measuring an undefined voltage.

Then, blow_en may be asserted, thereby causing output of the blow controller 150 to go to a digital 0. The digital 0 of the driver enable signal driver_en turns the blow drivers 205, 215 on. Subsequently, the write line transistors 204, 214 may be turned on by providing an appropriate signal at their gate terminals. When blow drivers 205, 215 and write line transistors 204, 214 are on, current flows through both the reference resistor 202 and the fuse 212. At this point, the voltage at node DBL is higher than the voltage at node BL. Comparator 220 may then be enabled by, e.g., global control block 170 asserting sense_en.

Comparator 220 senses the two different voltages at its inputs and, in response, outputs a digital 0. As noted above, in some examples, it may take approximately 0.5 µs or so for fuse 212 to blow. However, the scope of implementations is not limited to any particular value for blow current or for a time to blow. As recognized above, process variation may result in some fuses taking longer or shorter to blow, even when a same blow current is applied. In any event, after some amount of time, fuse 212 blows, and its resistance increases by multiple orders of magnitude. As a result, the voltage at node BL increases, whereas the voltage at node DBL may stay the same because the reference resistor 202 does not change during the blowing procedure.

As noted above, when the fuse 212 is not blown, the voltage at DBL may be higher than the voltage at BL. However, once the fuse 212 blows, the voltage at BL is higher than the voltage at DBL. The voltages are sensed by the comparator 220, and the change in the relationships of the voltages at nodes DBL, BL causes the comparator to change its output to a digital 1.

The blow controller 150 receives the output from the comparator, which is now a digital 1. In response, the blow controller 150 changes the driver enable signal driver_en from a digital 0 to a digital 1, thereby disabling blow drivers 205, 215. Thus, blow drivers 205, 215 stop providing currents to their respective bit lines. The operation described with respect to FIG. 2 results in a blown fuse 212, where the fuse 212 is exposed to enough current to cause it to blow but not enough current to cause it to be overblown.

In one example implementation, the delay caused by blow controller 150 receiving a digital 1 and then disabling the drivers 205, 215 is about 3 µs, which is around an order of magnitude lower than the time associated with blowing fuse 212. In other words, in this example implementations, the delay from comparator 220 and blow controller 150 may be negligible compared with the time associated with blowing fuse 212. Of course, the scope of implementations is not limited to any specific time for operation of comparator 220 or blow controller 150.

Figure 3:
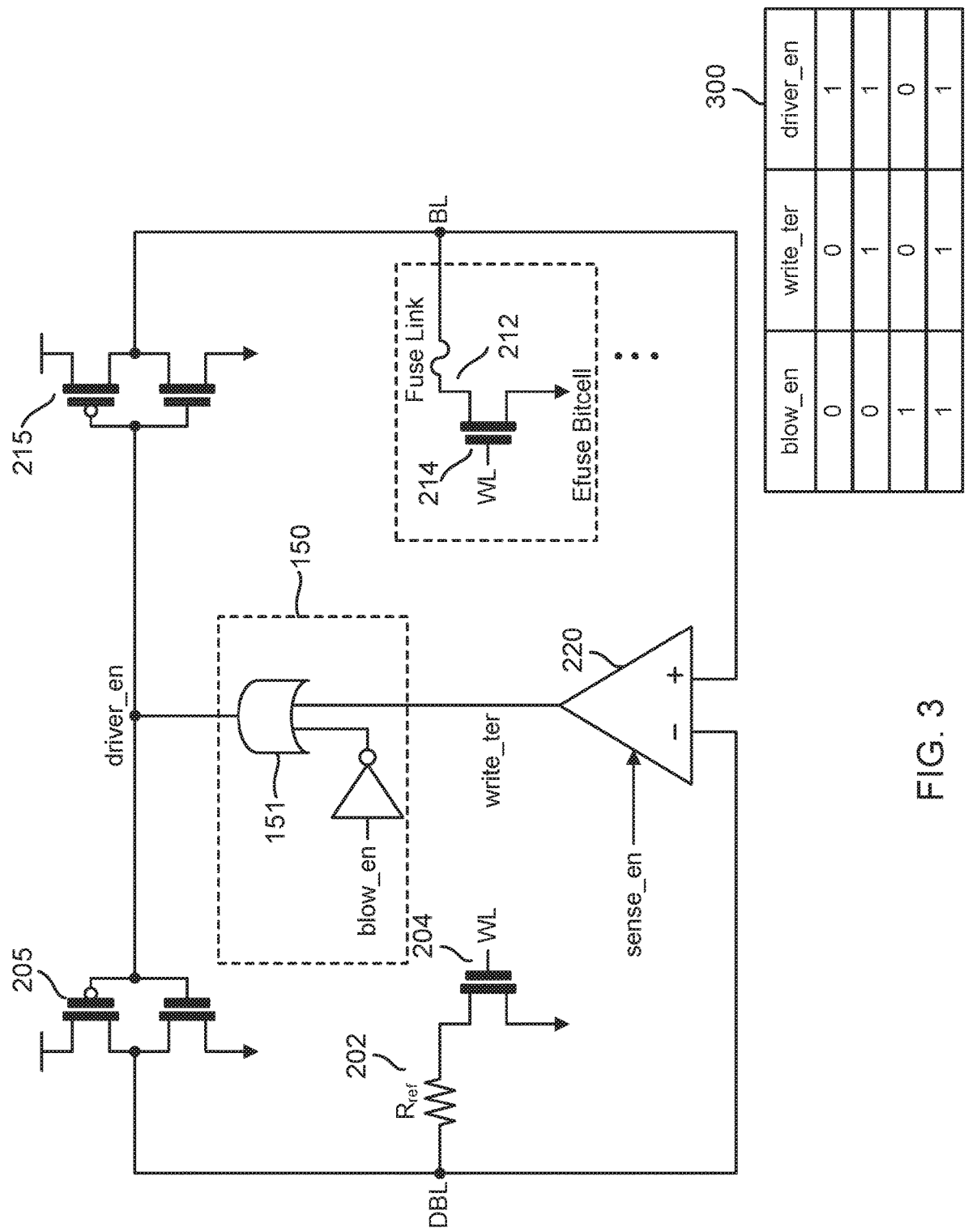
FIG. 3 is an illustration of an example physical architecture of one OTP cell and a programming feedback loop, according to one implementation.

FIG. 3 is an illustration of an example physical architecture of one OTP cell and a programming feedback loop, according to one implementation. In the example of FIG. 3, the various components are the same as those shown in FIG. 2. However, more detail is shown for one example implementation of blow controller 150. Specifically, in the example of FIG. 3, blow controller 150 includes an OR gate 151, which has two inputs. The first of the input receives the output from comparator 220, and the other input receives an inverted blow_en. Operation is indicated in the truth table 300. According to the truth table 300, blow drivers 205, 215 are turned on only if blow_en is a digital 1 and the output of the comparator (write_ter) is a digital 0. Otherwise, the drivers 205, 215 are turned off. This is consistent with the behavior described above with respect to FIG. 2.

Figure 4:
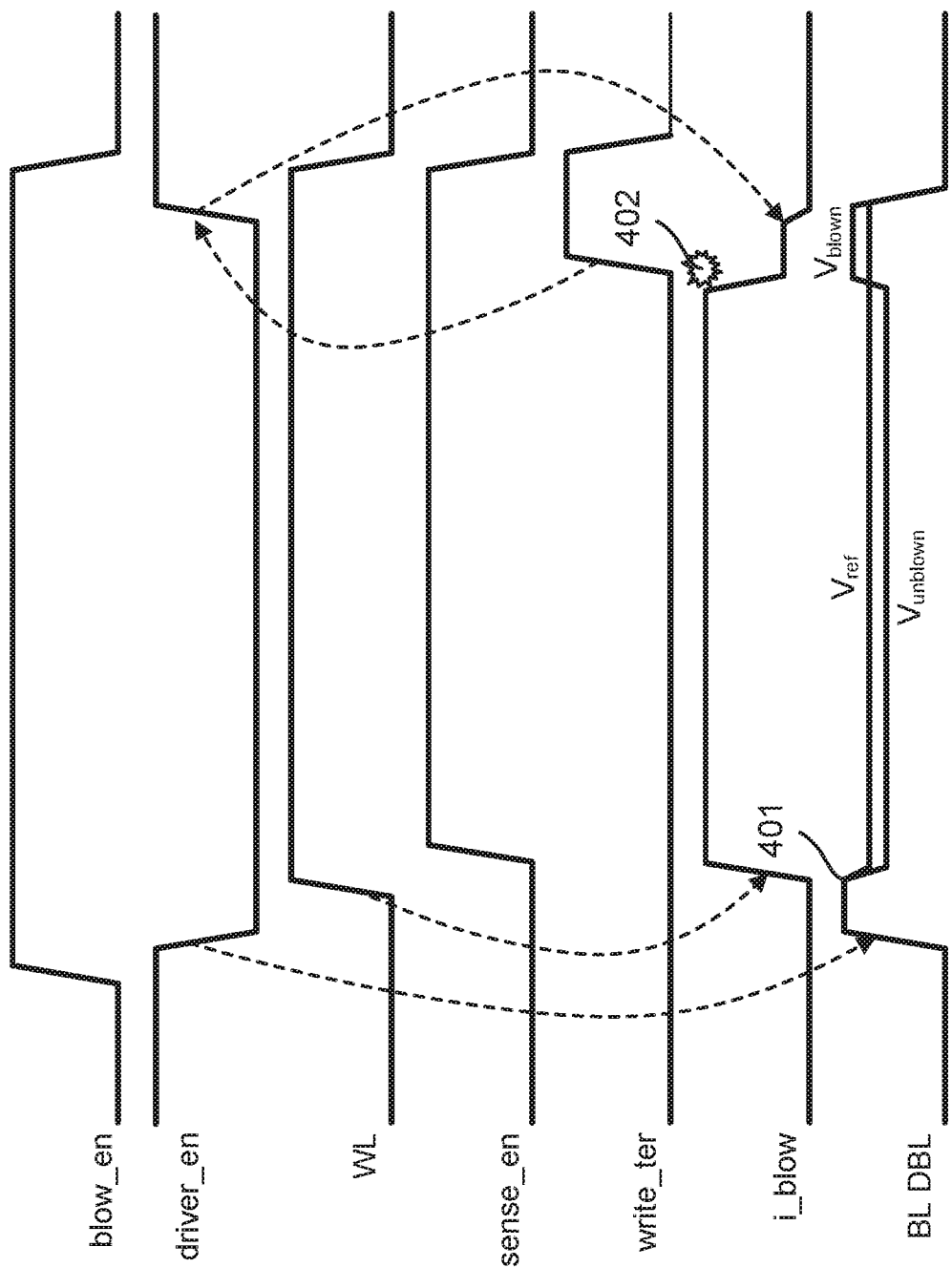
FIG. 4 is an illustration of an example timing diagram for the physical architectures of FIGS. 2, 3, 9, adapted according to one implementation.

FIG. 4 is an illustration of a timing diagram, which applies to the implementations shown in FIGS. 2 and 3. At time 401, blow drivers 205, 215 are on, as are the word line transistors 204, 214, thereby allowing blow current (i_blow) through the reference resistor 202 and the fuse 212. At time 401, fuse 212 is not blown, so the voltage at DBL (Vref) is higher than the voltage at BL (Vunblown). However, at time of 402, fuse 212 blows and the voltage at DBL (Vref) is now lower than the voltage at BL (Vblown). This causes the output of the comparator 220 (write_ter) to go high, which changes the state of the driver enable signal (driver_en), thereby causing the blow current i_blow to go to zero. Once again, the drivers 205, 215 are turned off, thereby reducing or eliminating current that would otherwise be applied to the fuse 212 after it blows.

Of course, FIGS. 2-4 are directed to only a single fuse 212. However, as noted with respect to FIG. 1, cores 110 may include arrays of OTP elements that are arranged in rows and columns, where the columns correspond to bit lines. In other words, various implementations may blow each of the OTP elements to be blown using the same arrangement as shown in FIGS. 2-4. In fact, in some implementations, the OTP elements to be blown are blown one by one, column by column and row by row until each of the fuses to be blown have been blown. For instance, the global control block 170 may apply address signals to blow controller 150 to control a multiplexor function that goes column by column. An example implementation including multiple bit lines in a multiplexor is illustrated in FIG. 5.

Figure 5:
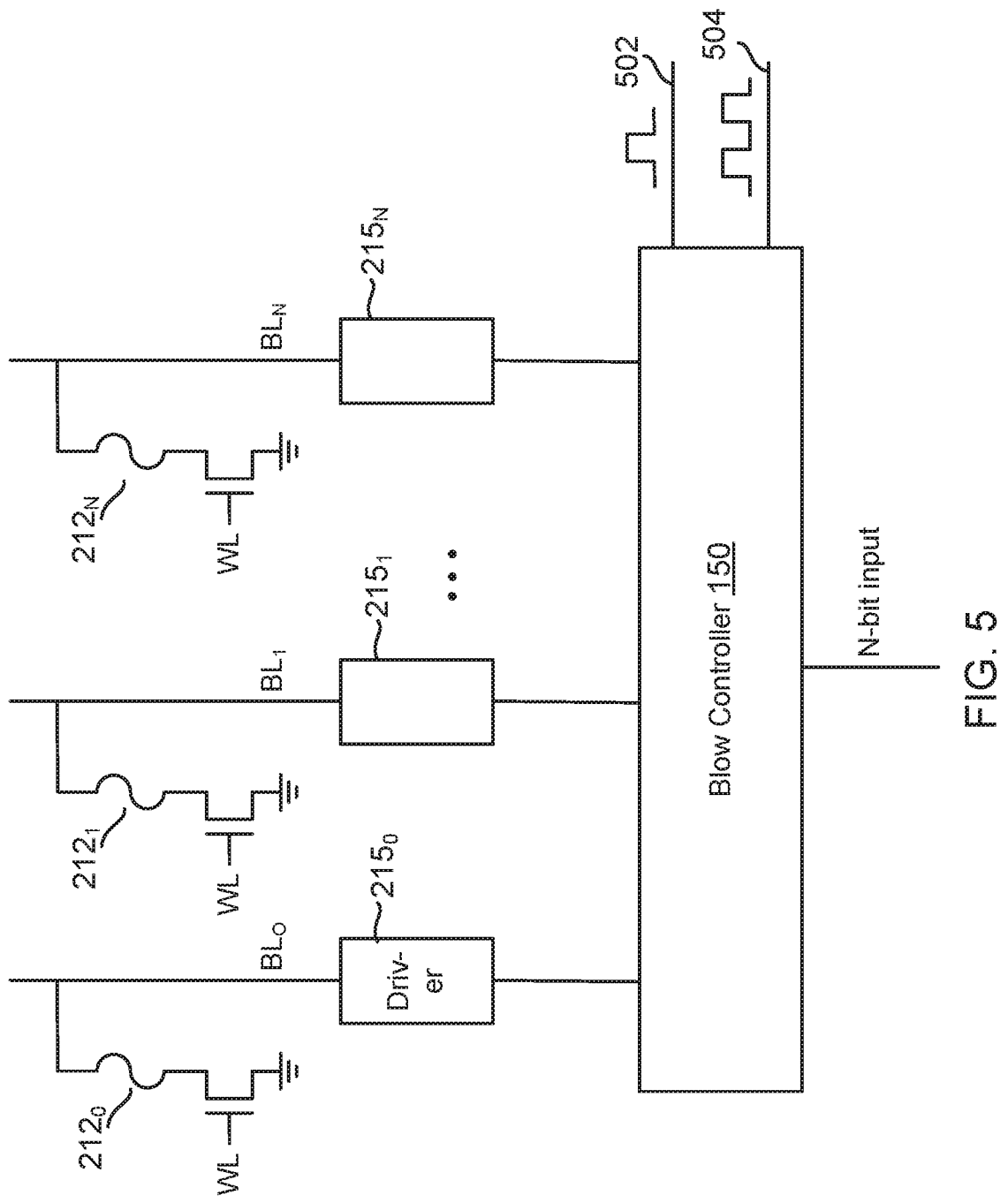
FIG. 5 is an illustration of multiple fuses coupled to a multiplexor, according to one implementation.

The example implementation of FIG. 5 shows an example in which there are N bit lines in a given core (110a or 110b). N can be any appropriate integer greater than one, and in this example is 64. However, the scope of implementations is not limited to any particular number of bit lines. Blow controller 150 has an integrated multiplexing function, which is controlled by an N-bit input, where a zero in the N-bit input indicates that a corresponding fuse should not be blown, and where a one in the N-bit input indicates that a corresponding fuse should be blown. Blow controller 150 includes other inputs 502 and 504, where, e.g., input 502 may the blow_en and input 504 may be write_ter. Blow controller 150 may receive the N-bit input from global control block 170.

Having received the N-bit input, blow controller 150 controls each of the drivers 215 one by one to either blow or not blow their respective fuses. Specifically, blow controller 150 may provide a driver_en as a digital 0 to driver $215_0$, assuming the N-bit input indicates that driver $215_0$ should be blown. Although not shown in FIG. 5, blow controller 150 also causes the blow driver 205 of the dummy bit line to turn on or off, as described above with respect to FIGS. 2-4. And, although further not shown in FIG. 5, blow controller 150 may also multiplex an input to comparator 220 so that comparator 220 receives a voltage input from the appropriate bit line $BL_0$-$BL_N$ as the blow controller 150 goes bit line by bit line.

Once driver $215_0$ blows fuse $212_0$, blow controller 150 advances to the next driver $215_1$. Assuming the next driver $215_1$ is associated with a fuse to be blown, then blow controller 150 performs the same blowing technique. However, assuming the next driver $215_1$ is associated with a fuse not to be blown, then blow controller 150 does not cause driver $215_1$ to generate blow current and, instead, moves to the next driver $215_2$ and on and on until blow controller 150 has addressed driver $215_N$.

Once blow controller 150 has addressed driver $215_N$, then the process performs the same at the next row (a different word line). In one example, global control block 170 provides a new N-bit input to blow controller 150, and blow controller 150 controls each of the drivers $215_0$-$215_N$ according to the new N-bit input. The process continues until the last driver $215_N$ in the last row has been addressed. This process is performed for the other core 110a or 110b as well.

In the example described above, each of the fuses 212 are blown one by one as the blow controller 150 advances through the columns and the rows. As noted above, such process may take noticeable time to complete. However, the implementation described above may provide an advantage of taking a shorter time overall to blow fuses in the cores 110 because the time that would otherwise have been used to overblow some fuses is reduced or eliminated.

The scope of implementations is not limited to a blow controller having integrated multiplexing functionality. In some implementations, the multiplexing functionality may be performed by a separate multiplexor unit. Furthermore, some implementations may provide a single driver 215 and multiplex its blow current, rather than providing N drivers, as shown in FIG. 5. However, the implementation shown in FIG. 5 may be more suitable for some applications because it avoids passing blow current through a multiplexor, which may damage the multiplexor or interfere with the level of blow current.

Figure 6:
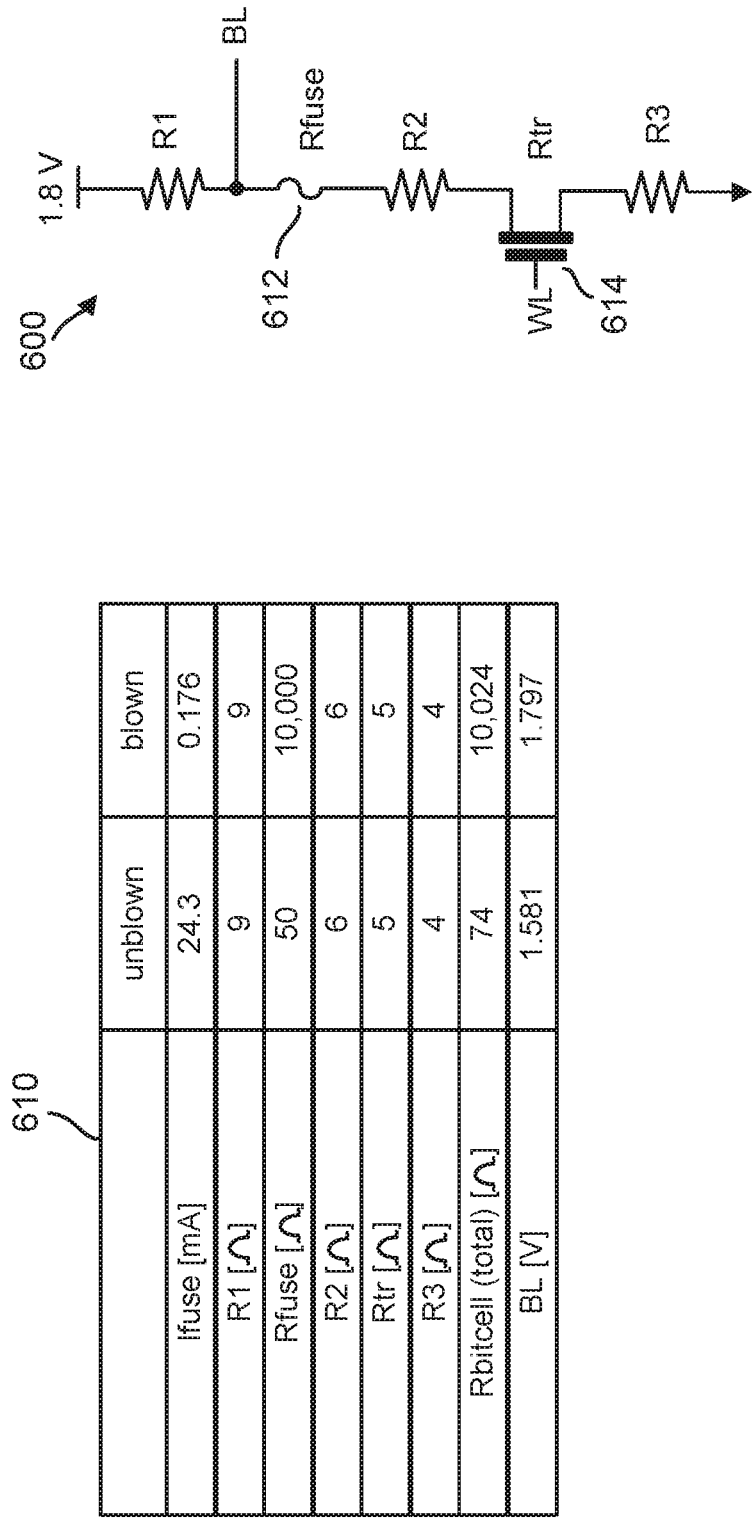
FIG. 6 is an illustration of an example current path for a fuse, according to one implementation.

FIG. 6 illustrates an example path 600 for an OTP cell from driver to ground, according to one implementation. In this example, the driver (not shown) may provide its current at 1.8 V as provided by a power supply. However, the scope of implementations is not limited to any particular voltage supply. The bit line itself has a parasitic resistance that is indicated as R. The fuse 612 has a resistance, which is indicated as Rfuse. As noted in the examples above, the resistance of the fuse 612 is less when the fuse is unblown and greater when the fuse is blown. The path from the fuse 612 to ground includes parasitic resistance R2 at a first terminal of the word line transistor 614. Word line transistor 614 also has an associated resistance (Rtr), and parasitic resistance between the other terminal of the transistor 614 and ground is shown as R3.

Table 610 provides example values for fuse current (if-use), the various resistances as discussed above, and the voltage at node BL (corresponding to the node BL in FIGS. 2 and 3). Once again, the values in table 610 are for example only, and the scope of implementations is not limited to any of these particular values. Rather, any appropriate values may be used in other implementations.

Of note in this example is the difference between the BL voltage for the unblown state and the BL voltage for the blown state, which is 216 mV. In some examples, 216 mV provides sufficient margin for comparator 222 detect a difference between each of those voltages at BL and a reference voltage that is approximately in the middle of those voltages. Such resistance values, voltages, and current may be implemented on an SOC, such as might be used in a smart phone or tablet.

Figure 7:
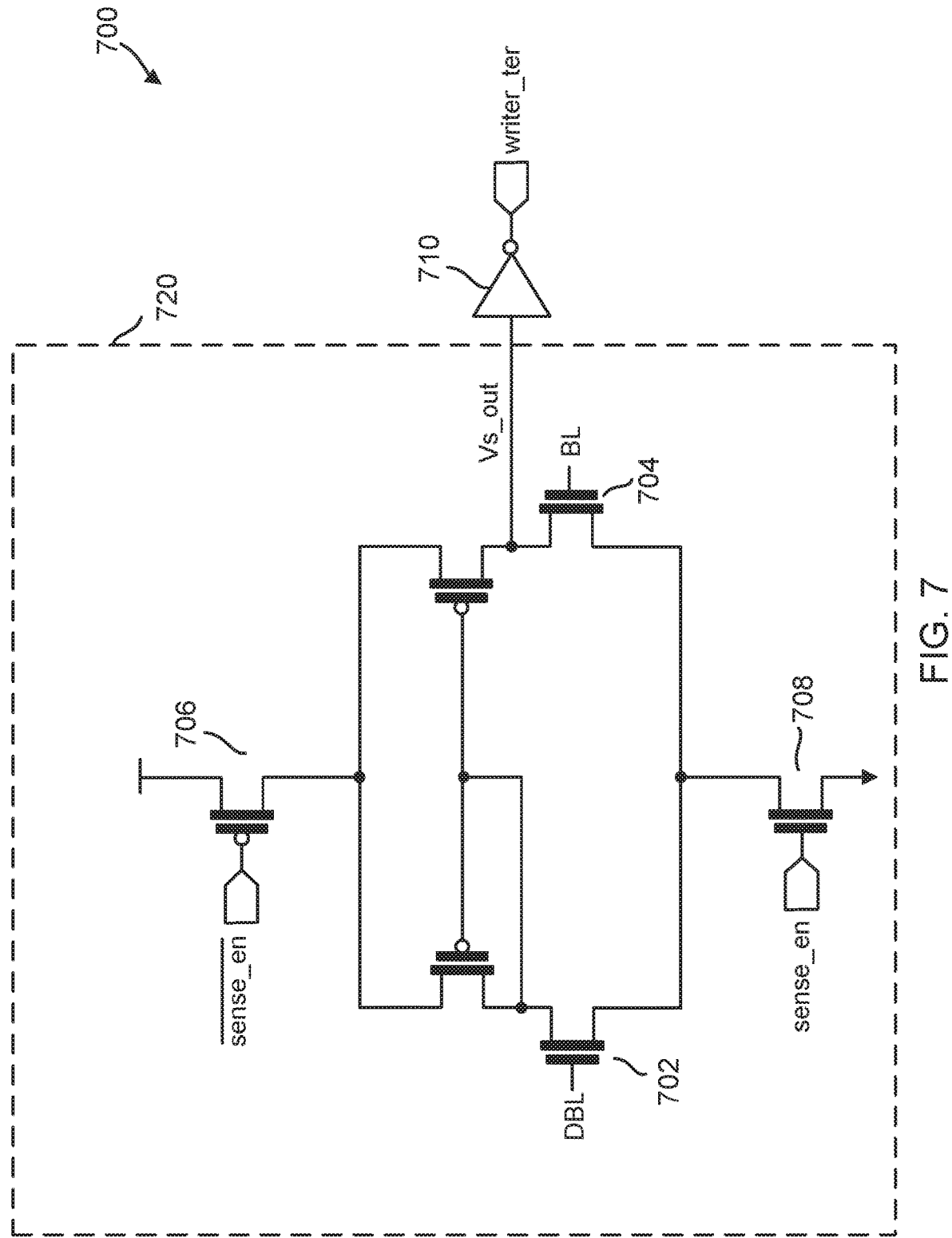
FIG. 7 is an illustration of an example comparator for use with the programming feedback loop of FIGS. 2, 3, and 9.

FIG. 7 is an illustration of an example comparator 700, according to one implementation. Comparator 700 may be implemented as comparator 220 in the architectures shown in FIGS. 2 and 3. In the example of FIG. 7, comparator 700 includes a symmetrical sense amplifier. Comparator 700 includes two NMOS inputs 702, 704, which receive the voltage from the DBL and BL nodes, respectively. The comparator 700 is enabled by inverted enable signal sense_en at transistor 706 and enable signal sense_en at transistor 708. Similar inputs are shown in the examples of FIGS. 2 and 3 as well.

The gate of transistor 702 represents the inverting input of the comparator. Similarly, the gate of transistor 704 represents the non-inverting input of the comparator.

The sense amplifier 720 of FIG. 7 compares the voltage from BL to the reference voltage from DBL and outputs either a high or low voltage value at Vs_out in response thereto. For instance, if the voltage from node BL is lower than the reference voltage at node DBL, then the sense amplifier may output a high voltage. On the other hand, if the voltage received from node BL is higher than the reference voltage at node DBL, then the sense amplifier may output a low voltage. Sense amplifier 720 performs the comparison when it receives the enable signal (sense_en).

In the example of FIG. 7, the output of the sense amplifier 720 is applied to an inverter 710. The inverter 710 inverts Vs_out to provide the signal write_ter, as shown in FIGS. 2 and 3.

Figure 8:
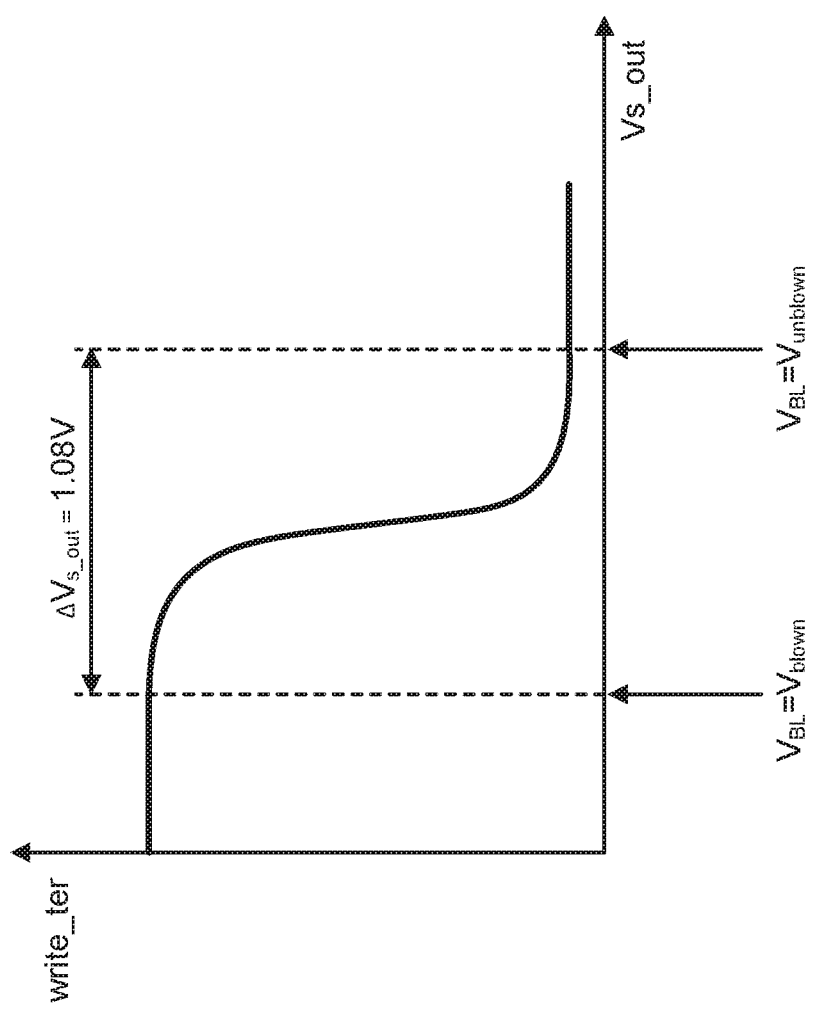
FIG. 8 is an illustration of example signal levels within the comparator of FIG. 7.

FIG. 8 is an example voltage diagram for the circuit shown in FIG. 7. Of note is that the output signal Vs_out swings by a delta of about 1.08V when the voltage at node BL swings by approximately 216 mV (as in FIG. 6). In this example, the 1.08V swing is enough to trigger the inverter 710, thereby ensuring an accurate write_ter signal. Of course, the scope of implementations is not limited to any particular voltage level, as other implementations may be designed differently. Nevertheless, it is noted that the voltage, current, and resistance values shown in FIGS. 6-8 are implementable in a system on chip.

Furthermore, the architecture of the comparator 700 is for example only, and the scope of implementations is not limited thereto. For instance, other comparator architectures now known or later discovered may be used for comparator 220 in the examples of FIGS. 2 and 3. However, symmetrical sense amplifiers, such as shown in the example of FIG. 7, may have an advantage of being less susceptible to process variation and may have a greater sensing margin than other comparator designs.

Figure 9:
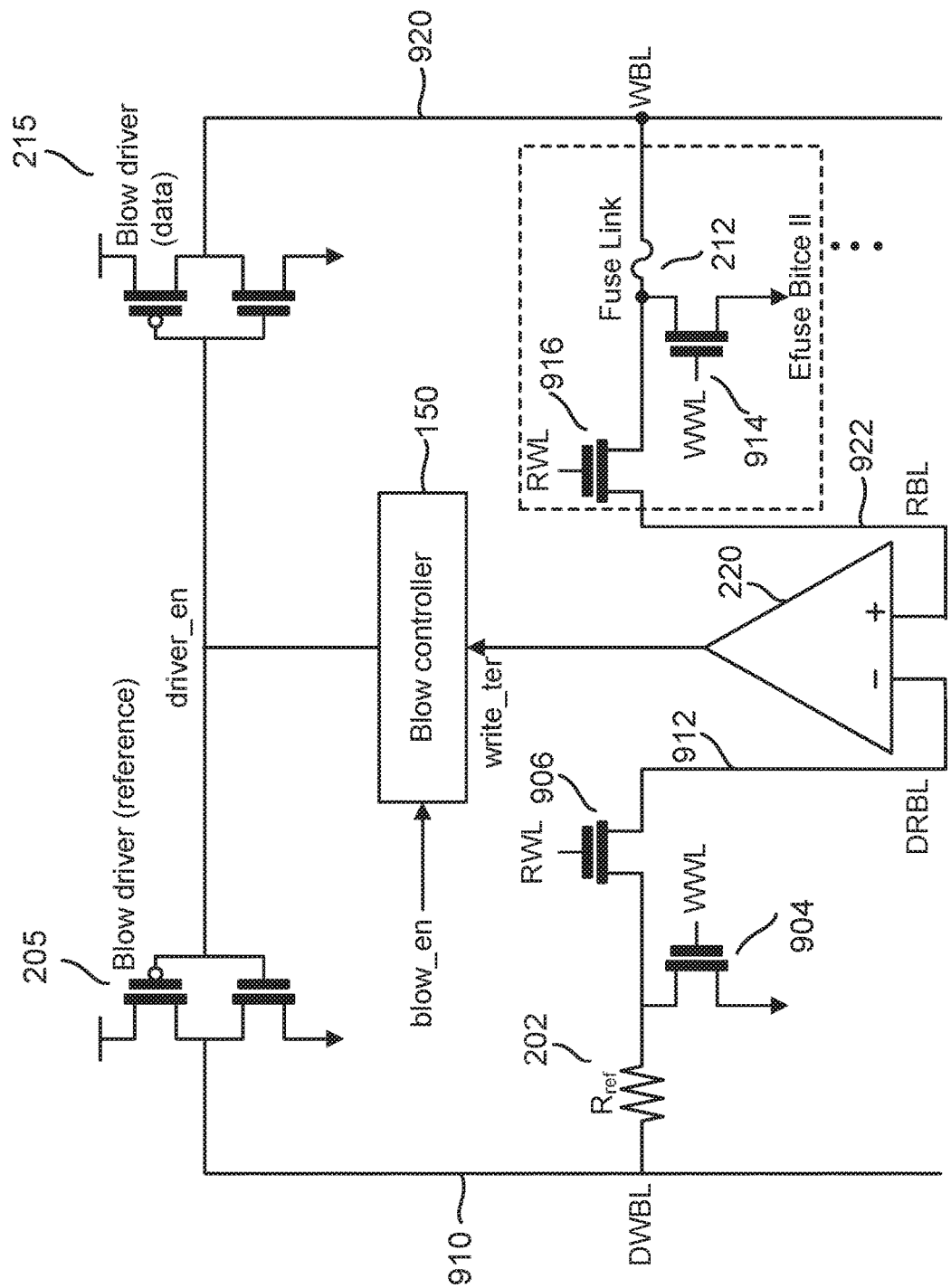
FIG. 9 is an illustration of an example physical architecture of one OTP cell and a programming feedback loop, according to one implementation.

FIG. 9 is an illustration of another physical architecture of one OTP cell and a programming feedback loop, according to one implementation. The architecture of FIG. 9 is similar to that shown in FIGS. 2 and 3. However, the architecture of FIG. 9 senses the bit line voltages on read bit lines rather than write bit lines, as shown in FIGS. 2 and 3. Put another way, FIG. 9 shows a split bit cell architecture having a read path and a write path. Specifically, looking more closely at FIG. 9, the dummy bit line includes dummy write bit line 910 and dummy read bit line 912. Similarly, the bit line associated with the fuse 212 includes write bit line 920 and read bit line 922.

Looking at the dummy bit line first, it includes write word line transistor 904 and read word line transistor 906. This is in contrast to the examples of FIGS. 2 and 3, which have word line transistor 204. Assuming that the blow current is in the range of about 20 mA, then the word line transistor 204 may be sized to be large enough to handle that amount of current. However, it may be expected that a larger transistor may have greater leakage, which is typically undesirable. Therefore, the example of FIG. 9 uses two different transistors 904, 906 to separate the read path from the write path, allowing the transistor 904 in the write path to be turned off and saving leakage current. An advantage of this implementation may include increased energy efficiency resulting from less leakage.

Now looking at the bit line with the fuse 212, it includes write word line transistor 914 and read word line transistor 916. Similar to the arrangement on the dummy bit line side, the read paths and write paths are separated using the two transistors 914, 916. This allows the transistor 914 in the write path to be turned off to save leakage current.

In one example, the global control block 170 may provide control signals to the gates of transistors 904, 906, 914, 916 to control those transistors to be turned on and off during read and write operations. For instance, during a write operation, transistors 904, 906 and transistors 914, 916 are on, thereby allowing comparator 220 to sense the voltage on the respective bit lines DRBL and RBL. During a read operation, transistors 904, 914 may be turned off, whereas transistors 906, 916 may be turned on.

As compared to the implementations of FIGS. 2 and 3, the implementation of FIG. 9 also compares voltages from bit lines, though the implementation of FIG. 9 couples the inputs of comparator 220 to read bit lines DRBL and RBL. Comparator 220 and blow controller 150 operate substantially the same as in the implementations of FIGS. 2 and 3. In other words, blow controller 150 causes drivers 205, 215 to turn off once comparator 220 detects that fuse 212 is blown.

Figure 10:
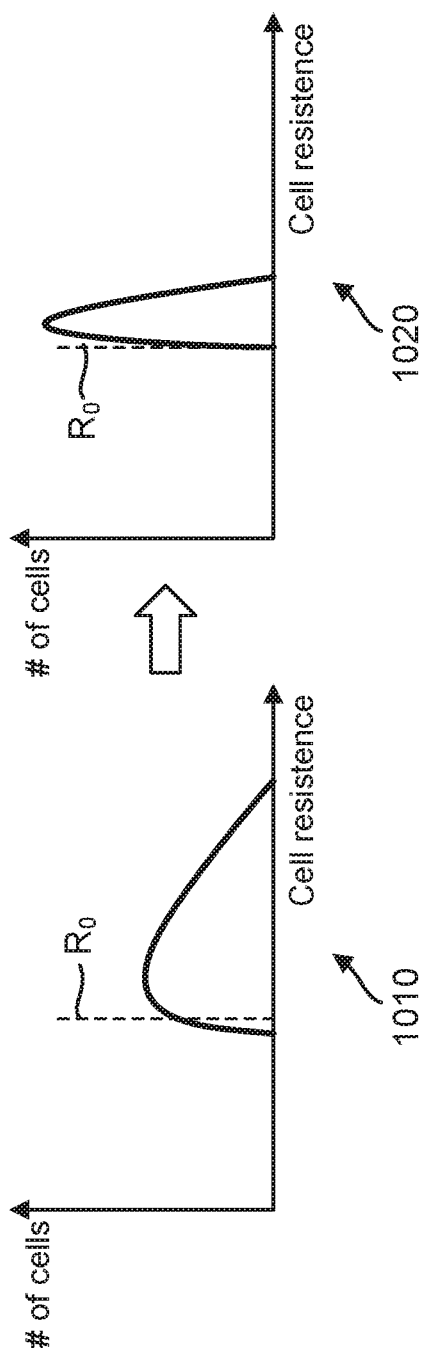
FIG. 10 is an illustration of distribution of OTP cell resistance, according to one implementation.

FIG. 10 is an illustration of OTP cell resistance distribution, according to one implementation. In the implementation in the graph 1010, OTP cell resistance is spread along a relatively wide band. Ro represents a resistance in the system design at which a blown fuse triggers the comparator 220 and causes the blow current to turn off. However, rather than using a comparator to cause the blow current to turn off, graph 1010 corresponds to an implementation that applies a same blow current for a same amount of time to all OTP cells to be blown. In other words, graph 1010 corresponds to an open-loop implementation that does not verify whether a fuse is blown. Graph 1010 shows that a few OTP cells are under blown, whereas many OTP cells are overblown, and the range of under blown to overblown is relatively large.

By contrast, the graph 1020 corresponds to an implementation, such as that described above with respect to FIGS. 1-9 in which a comparator is used to turn blow current off.

As is apparent from graph 1020, almost no OTP cells are under blown, and the range of resistances is relatively narrow. Thus, the implementations described above with respect to FIGS. 1-9 may provide increased precision in fuse resistance by applying enough current for enough time to blow a fuse, thereby verifying that a fuse is blown, and reducing or eliminating overblown current. An advantage of such implementations is that they may increase yield by more precisely writing fuses and also verifying that fuses are blown.

Also, the increased precision shown in graph 1020 may arise from using a same reference resistance to verify blown status of the fuse. Specifically, in the architectures of FIGS. 2, 3, and 9, the reference resistor 202 may be used to verify a blown status of each of the fuses in a given core 110a or 110b. In some implementations, each core 110a, 110b may have its own dummy bit line and its own reference resistor 202, verifying blown status for each of the OTP cells in its array. In other implementations, the cores 110 may share a reference resistor 202. In any event, an advantage may include consistency, as demonstrated by graph 1020, because blown status of a fuse may be verified against a consistent reference voltage regardless of its column or row within the array.

Figure 11:
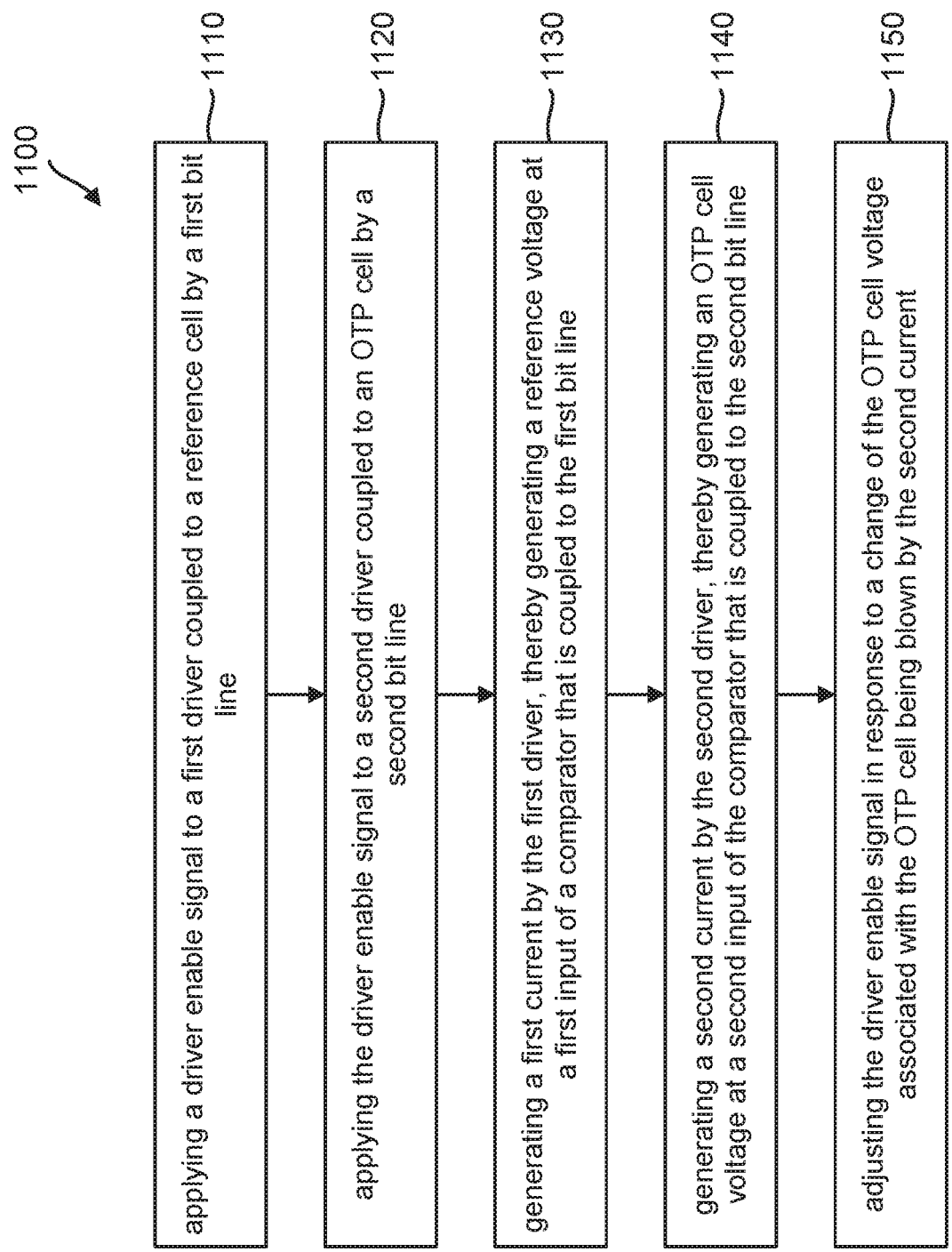
FIG. 11 is an illustration of an example method of programming an OTP cell, according to one implementation.

A flow diagram of an example method 1100 of writing data to an OTP memory is illustrated in FIG. 11. In one example, method 1100 is performed by blow controller 150 and global control block 170 of FIG. 1. Method 1100 may be performed during manufacture, assembly, or verification of a device. For instance, method 1100 may be performed during manufacture or verification of an SOC in which the OTP memory is implemented. In another example, method 1100 may be performed during assembly or verification of a larger device (e.g., smart phone or laptop) in which the SOC is used. In implementations, once the fuses are blown, they may not be able to be reversed, so the writing process may be performed only once per fuse and may be permanent.

At action 1110, a driver enable signal is applied to a first driver, which is coupled to a reference cell by a first bit line. An example is shown in FIGS. 2, 3, and 9 in which blow driver 205 is coupled to the reference resistor 202 by a dummy bit line. An example driver enable signal is shown as driver_en.

In the implementations of FIGS. 2, 3, 9, blow driver 205 is shown as an inverter coupled between power supply (e.g., VCC) and ground. However, the scope of implementations is not limited to using inverters as blow drivers, as any appropriate driver circuit may be used. Furthermore, while driver_en is shown as turning on drivers 205, 215 by a low signal (digital 0), it is understood that any appropriate enable signal for a given driver may be used. The enable signal may be provided by any appropriate circuit, such as blow controller 150.

At action 1120, a driver enable signal is applied to a second driver coupled to an OTP cell by a second bit line. An example is shown in FIGS. 2, 3, and 9, in which blow driver 215 is coupled to fuse 212 by the bit line. Further in the example, the driver enable signal (driver_en) is the same as that provided to the dummy bit line and reference resistor, though the scope of implementations may include separate enable signals for the two drivers.

At action 1130, the first driver generates a first current, thereby generating a reference voltage. In this example, the reference voltage is applied to a first input of a comparator that is coupled to the first bit line.

An example is shown in FIGS. 2, 3, 9, in which the blow driver 205 generates a current through reference resistor 202 and word line transistor 204, 904 thereby generating a reference voltage at node DBL, which is applied to the inverting input of comparator 220.

At action 1140, the second driver generates a second current. An example is shown in FIGS. 2, 3, and 9, in which blow driver 215 generates a current through fuse 212 and word line transistor 214, 914 (respectively). The fuse 212 has a resistance when it is unblown which causes a relatively low voltage to be applied to the non-inverting input of comparator 220. In the example of FIG. 2, the voltage is applied to the comparator 220 at node BL. In the example of FIG. 9, the voltage is applied to comparator 220 by read bit line RBL.

Continuing with the example, the second current may cause the fuse to blow, thereby changing the resistance of the fuse. The change in resistance of the fuse may cause the voltage at the bit line and non-inverting input of the comparator to increase.

At action 1150, the driver enable signal is adjusted in response to the change of the OTP cell voltage. In the example of FIGS. 2, 3, 9, the driver enable signal turns the drivers 205, 215 on by using a low voltage (digital 0) value. Therefore, action 1150 may in some instances include changing the driver enable signal to a high voltage (digital 1) value. Of course, the scope of implementations is not limited to asserting an enable signal to turn off the drivers. Rather, other implementations may de-assert an enable signal or otherwise adjust a voltage or current event enable signal to turn off drivers as appropriate for a given driver.

At action 1150, the driver enable signal is adjusted in response to the change of the OTP cell voltage associated with the OTP cell being blown by the second current. Looking at the example of FIGS. 2, 3, 9, the voltage at the node BL changes relative to the voltage at node DBL, thereby causing a change in the output of the comparator 220, which triggers the blow controller to adjust the driver enable signal.

In an alternative implementation, method 1100 may be performed with an antifuse rather than a fuse. In an antifuse implementation, current is applied to the antifuse, which at first has a high resistance value, but as the current flows, it may cause change in the metal constituting the antifuse, which may result in a lower resistance value. In other words, when the antifuse is "blown," it's resistance may go down.

In an antifuse implementation of method 1100, and antifuse may be used in place of fuse 212, and the reference resistor 202 may be selected so that its reference resistance is between the blown and unblown resistance values of the antifuse. In this example, the output value from the sense amplifier shown in FIG. 7 may be reversed when compared to the fuse implementation shown in FIGS. 2, 3, 9. Therefore, an antifuse implementation may omit inverter 710 from the output of the sense amplifier of FIG. 7. Alternatively, the antifuse implementation may add yet another inverter (not shown) to the output of the sense amplifier of FIG. 7. In yet another example, the sense amplifier implementation of FIG. 7 may be left as it is, but the inputs to the comparator 220 may be switched so that the dummy bit line voltage is applied to the non-inverting input and the bit line voltage is applied to the inverting input. In any event, once the antifuse is blown, it causes the voltage at node BL to drop, thereby changing the output of the comparator 220 and causing the blow controller to adjust the driver enable signal, thereby turning off the drivers 205, 215.

In other words, the scope of implementations is not limited to the specific method shown in FIG. 11. Rather, various implementations may use different OTP cells (e.g., fuses and antifuses), different comparator architectures, different blow controller architectures, and the like Other implementations may add, omit, rearrange, or modify one or more actions. For instance, method 1100 may be performed for each fuse to be blown in an OTP memory. For instance, an array of OTP cells in a ROM may include multiple thousands of fuses to be blown. In such an instance, the method of FIG. 11 may be applied to each one of the fuses to be blown. Accordingly, method 1100 may further include multiplexing column by column in the array of OTP cells so that each OTP cell to be blown is blown. An example was described above with respect to FIG. 5.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A One Time Programmable (OTP) memory, comprising:
   a first driver coupled to a reference cell by a first bit line;
   a second driver coupled to an OTP cell by a second bit line; and
   a comparator having a first input coupled to the first bit line and the reference cell, a second input coupled to the second bit line and the OTP cell, and an output coupled to a logic circuit configured to control the first driver and the second driver.

2. The OTP memory of claim 1, wherein the OTP cell comprises an electronic fuse (e-fuse).

3. The OTP memory of claim 1, wherein the OTP cell comprises an antifuse.

4. The OTP memory of claim 1, wherein the comparator comprises a symmetrical sense amplifier.

5. The OTP memory of claim 1, wherein the logic circuit comprises an OR gate having a first input configured to receive an enable signal and a second input configured to receive an output signal from the comparator.

6. The OTP memory of claim 1, wherein the reference cell comprises a resistor between the first bit line and a word line transistor, wherein the resistor is sized to cause a reference voltage at the first bit line that is lower than a voltage at the second bit line associated with the OTP cell being blown.

7. The OTP memory of claim 1, wherein the reference cell comprises a resistor between the first bit line and a word line transistor, wherein the resistor is sized to cause a reference voltage at the first bit line that is greater than a voltage at the second bit line associated with the OTP cell being unblown.

8. The OTP memory of claim 1, wherein the OTP cell comprises a fuse between the second bit line and a word line transistor.

9. The OTP memory of claim 1, wherein the first input of the comparator is coupled to the first bit line by a read word line transistor.

10. The OTP memory of claim 1, wherein the second input of the comparator is coupled to the second bit line by a read word line transistor.

11. The OTP memory of claim 1, wherein the first bit line comprises a read bit line.

12. The OTP memory of claim 1, wherein the second bit line comprises a read bit line.

13. The OTP memory of claim 1, further comprising:
wherein the logic circuit comprises a multiplexor coupled to a third driver having an additional OTP cell, and wherein the multiplexor is configured to provide an enable signal to the second driver and to the third driver.

14. A method comprising:
applying a driver control signal to a first driver coupled to a reference cell by a first bit line;
applying the driver control signal to a second driver coupled to an OTP cell by a second bit line;
generating a first current by the first driver, thereby generating a reference voltage at a first input of a comparator that is coupled to the first bit line;
generating a second current by the second driver, thereby generating an OTP cell voltage at a second input of the comparator that is coupled to the second bit line;
adjusting the driver control signal in response to a change of the OTP cell voltage associated with the OTP cell being blown by the second current;
changing an output signal of the comparator; and
adjusting the driver control signal based on the output signal of the comparator.

15. The method of claim 14, wherein adjusting the driver control signal comprises de-asserting a driver enable signal to the first driver and to the second driver.

16. The method of claim 14, wherein adjusting the driver control signal comprises asserting a driver enable signal to the first driver and to the second driver.

17. The method of claim 14, wherein adjusting the driver control signal comprises causing the second driver to stop generating the second current.

18. The method of claim 14, wherein generating the second current comprises:
blowing a fuse of the OTP cell.

19. The method of claim 14, wherein generating the second current comprises:
blowing an antifuse of the OTP cell.

20. A Read Only Memory (ROM), comprising:
means for producing a first current on a first bit line;
means for producing a second current on a second bit line;
a reference resistor coupled between the first bit line and a ground;
a One Time Programmable (OTP) cell coupled between the second bit line and the ground; and
means for turning off the second current producing means in response to a change in a voltage at the second bit line relative to a voltage at the first bit line.

21. The ROM of claim 20, wherein the turning off means comprises a comparator having a first input coupled to the first bit line, a second input coupled to the second bit line, and an output coupled to a logic circuit configured to enable the first current producing means and the second current producing means.

22. The ROM of claim 20, further comprising a multiplexor coupled to the second current producing means and a means for producing a third current on a third bit line.

23. The ROM of claim 22, further comprising a control circuit configured to provide an N-bit input to the multiplexor, wherein N is an integer equal to a number of OTP cells in the ROM.

24. The ROM of claim 20, wherein the turning off means comprises a sense amplifier configured to receive the voltage at the second bit line and the voltage at the first bit line.

25. The ROM of claim 20, wherein the OTP cell comprises an antifuse.

26. The ROM of claim 20, wherein the first current producing means comprises an inverter coupled to the first bit line, the inverter configured to receive an enable signal from the turning off means.

27. The ROM of claim 20, wherein the turning off means comprises:
a comparator configured to receive the voltage of the first bit line and the voltage at the second bit line; and
an OR gate receiving an output of the comparator and configured to provide an enable signal to the first current producing means and the second current producing means.

28. The ROM of claim 20, wherein the reference resistor is sized to cause the voltage at the first bit line to be lower than the voltage at the second bit line when the OTP cell is blown.

29. The ROM of claim 20, wherein the reference resistor is sized to cause the voltage at the first bit line to be higher than the voltage at the second bit line when the OTP cell is unblown.

30. The ROM of claim 20, wherein a first input of the turning off means is coupled to the first bit line by a read word line transistor.

* * * * *